United States Patent [19]
Lee

[11] Patent Number: 6,112,378
[45] Date of Patent: Sep. 5, 2000

[54] FASTENING DEVICE FOR A HEAT SINK

[75] Inventor: Richard Lee, Taipei, Taiwan

[73] Assignee: Foxconn Precision Components Co., Ltd., Taipei Hsien, Taiwan

[21] Appl. No.: 09/377,890

[22] Filed: Aug. 19, 1999

[30] Foreign Application Priority Data

Jun. 17, 1999 [TW] Taiwan ................................. 88210080

[51] Int. Cl.[7] ........................... F16B 13/00; F16B 19/00; H05K 7/20

[52] U.S. Cl. ............................... 24/458; 24/453; 24/457; 257/718; 361/704; 174/16.3; 165/80.3

[58] Field of Search ............................ 24/464, 473, 457, 24/458, 459, 472, 563, 546, 517, 572, 531, 453; 174/16.3; 165/80.3; 257/718; 361/704; 411/552, 913, 508, 509, 510

[56] References Cited

U.S. PATENT DOCUMENTS

| | | | |
|---|---|---|---|
| 2,515,827 | 7/1950 | Howard | 24/453 X |
| 5,384,940 | 1/1995 | Soule et al. | 24/453 |
| 5,730,210 | 3/1998 | Kou | 165/80.3 |
| 5,881,800 | 3/1999 | Chung | 165/80.3 |
| 5,901,039 | 5/1999 | Dehaine et al. | 361/704 |

*Primary Examiner*—Robert J. Sandy
*Attorney, Agent, or Firm*—Wei Te Chung

[57] ABSTRACT

The present invention provides a fastening device for attaching a heat sink to an electronic device package. The fastening device is unitarily formed to include a fastener and a C-shaped spring member. The spring member includes a center section and a pair of arcuate arms extending from opposite ends of the center section. The fastener perpendicularly extends from the center section. The spring member has a depressed surface for facilitating manual actuation. Each arm has a C-shaped flange at a distal end thereof.

8 Claims, 3 Drawing Sheets

FASTENING DEVICE FOR A HEAT SINK

BACKGROUND OF THE INVENTION

The present invention generally relates to a fastening device, and particularly to a fastening device for releaseably attaching a heat sink to a chipset package.

A heat sink is used with an electronic device package for transferring heat from the device contained in the device package and rapidly dissipating the heat to the atmosphere by conduction, convection and/or radiation. Various means have been used to attach heat sinks in intimate thermal contact with the electronic device package. Conventional fastening devices are disclosed in U.S. Pat. Nos. 4,712,159; 5,436,798; and 5,602,719. However, such fastening devices have large dimensions and complex structures requiring a considerable amount of material and complicating assembly. In order to facilitate an automatic assembly, a product or an element thereof should have a simple structure. The above fastening devices do not meet such a requirement and can not be conveniently manufactured automatically.

FIG. 1 shows a chipset package 600 mounted on a PCB 500 (Printed Circuit Board), a heat sink 200, and a pair of conventional fastening devices 100. The heat sink 200 includes a pair of wings 202 outwardly extending therefrom. An aperture 204 is defined through each wing 202 in alignment with a hole 502 defined in the PCB 500 The fastening device 100 includes a compression spring 400 and a fastener 300. The fasteners 300 extend through the springs 400, the apertures 204 and the holes 502 to attach the heat sink 200 to the PCB 500. The springs 400 provide elastic engagement among the fasteners 300, the heat sink 200 and the PCB 500. However, the fastening device 100 includes two elements thereby complicating assembly and hindering automatic manufacture.

Therefore, a fastening device which is unitarily made is desired.

SUMMARY OF THE INVENTION

Accordingly, the primary object of the present invention is to provide a unitary fastening device.

Another object of the present invention is to provide a fastening device which can be a conveniently assembled.

To fulfill the above-mentioned objects, the present invention provides a fastening device for attaching a heat sink to an electronic device package to dissipate heat generated therein. The fastening device is unitarily formed to include a fastener and a C-shaped spring member. The spring member includes a center section and a pair of arcuate arms extending from opposite ends of the center section. The fastener perpendicularly extends from the center section. The spring member has a depressed surface for facilitating manual actuation. Each arm has a C-shaped flange at a distal end thereof.

Other objects, advantages and novel features of the invention will become more apparent from the following detailed description when taken in conjunction with the accompanying drawings.

DETAILED DESCRIPTION OF A PREFERRED EMBODIMENT

Figure 1:
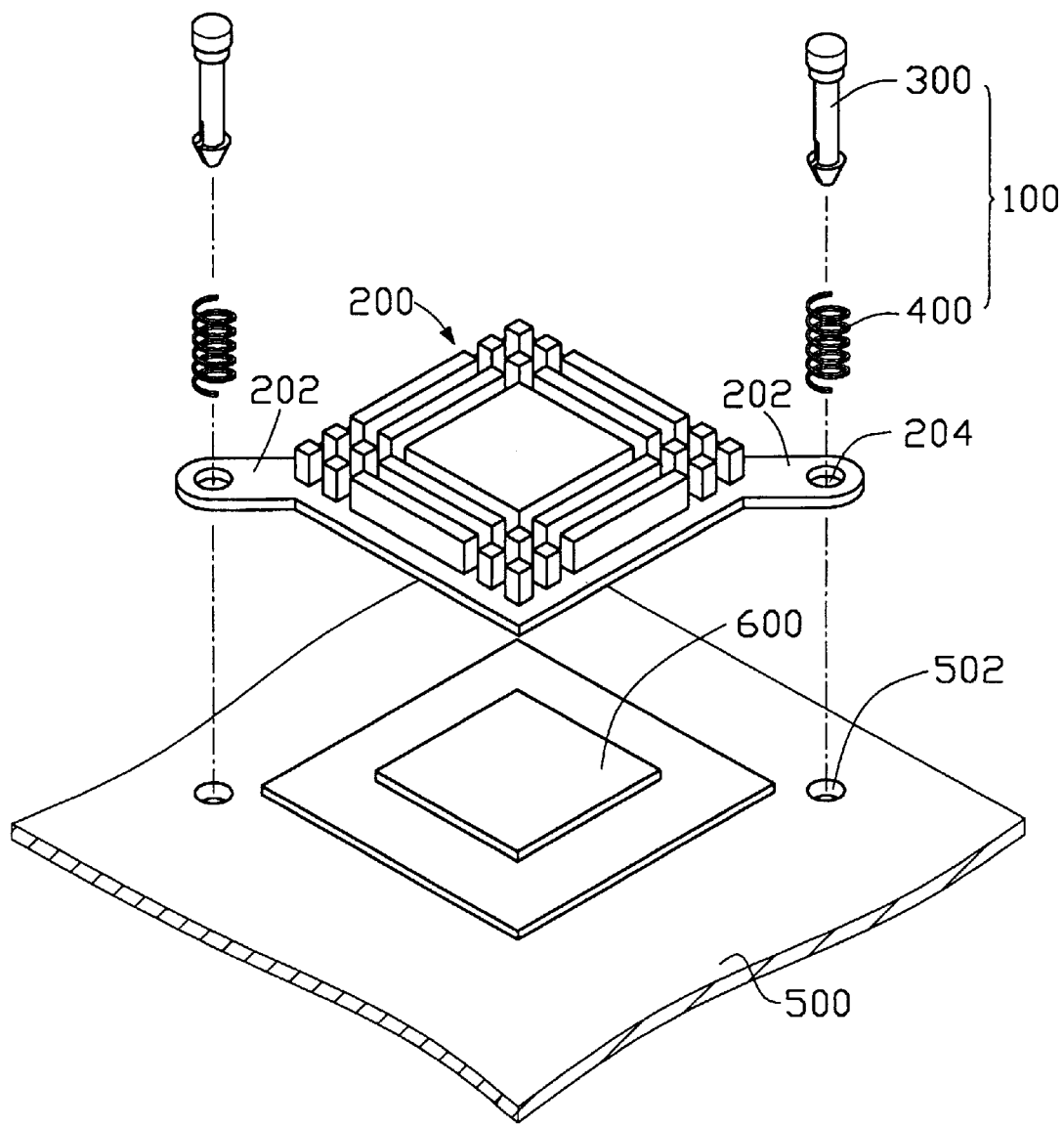
FIG. 1 is an exploded view of a PCB, a chipset package, a heat sink and a pair of conventional fastening devices.
Figure 2:
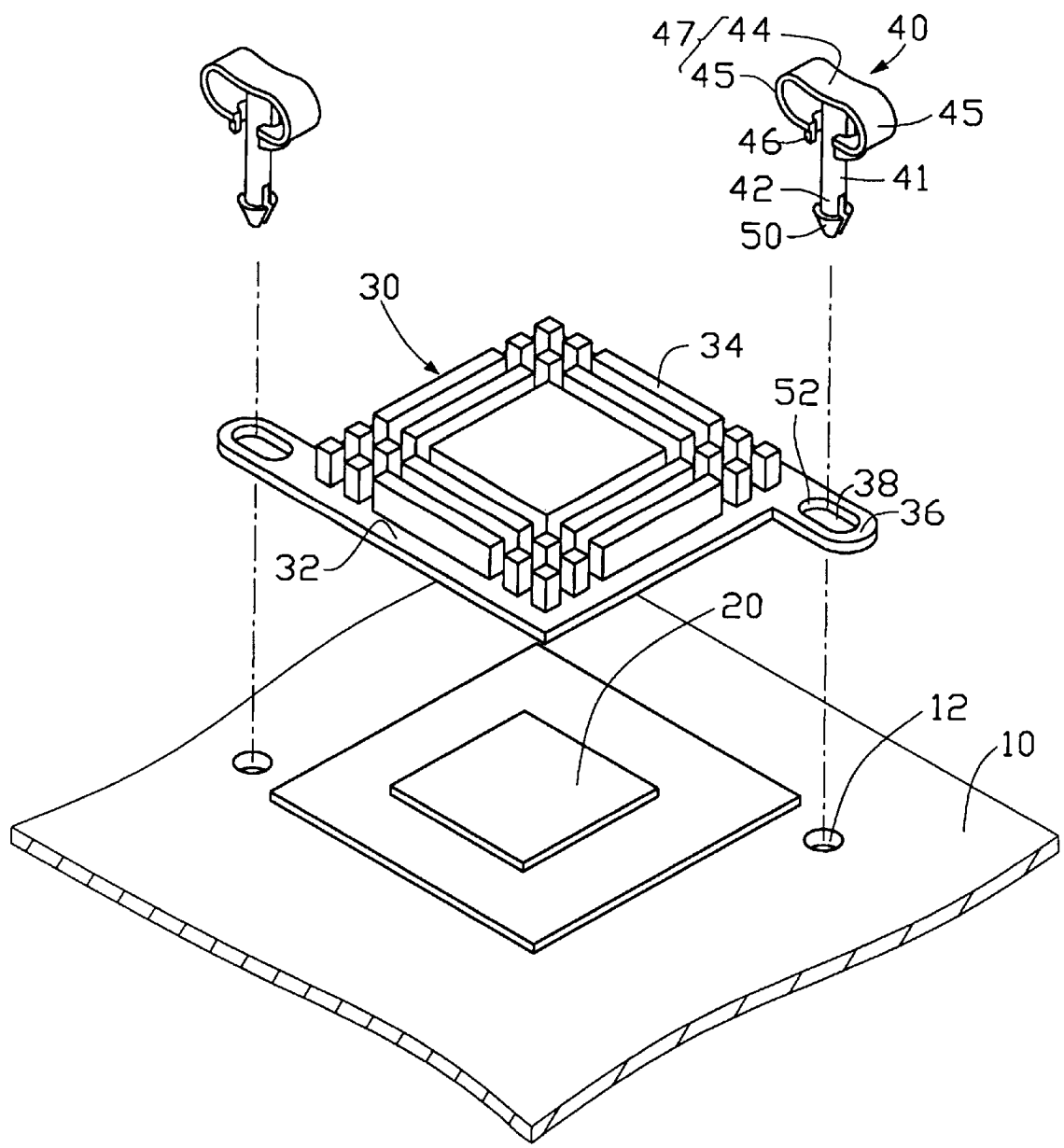
FIG. 2 is an exploded view of a PCB, a chipset package, a heat sink and a pair of fastening devices in accordance with the present invention.

FIG. 2 shows a PCB 10 and an electronic device package mounted on the PCB. In the illustrated embodiment, the electronic device package is a chipset package 20. A pair of holes 12 is defined in the PCB 10 proximate the chipset package 20. A heat sink 30 has a base 32 adapted for being attached to the chipset package 20 to transfer heat from the chipset package 20 and rapidly dissipate the heat to the atmosphere by conduction, convection and/or radiation. The heat sink 30 includes a pair of outwardly extending wings 36 and a plurality of upwardly extending fins 34 for efficient and rapid dissipation of heat therefrom. Each wing 36 defines an oval aperture 38 therethrough.

Figure 3:
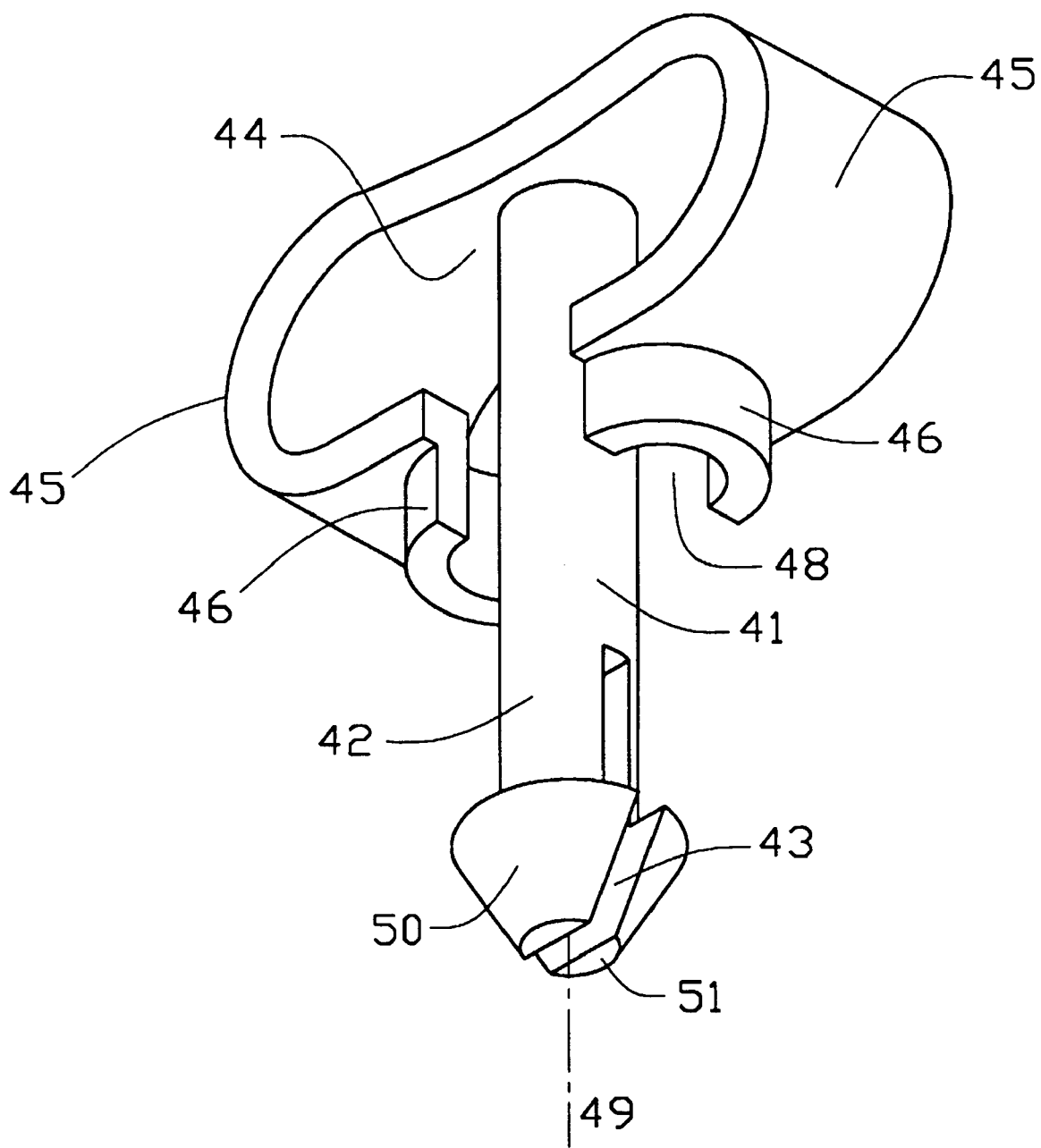
FIG. 3 is a perspective view of the fastening device of the present invention.

Also referring to FIG. 3, a pair of fastening devices 40 is adapted to latch the heat sink 30 to the chipset package 20 and maintain the heat sink 30 in intimate thermal contact with the chipset package 20. In the preferred embodiment, the fastening device 40 is unitarily formed from plastic to include a cylindrical fastener 41 and a spring member 47. The spring member 47 includes a center section 44 and a pair of arcuate arms 45 extending from opposite ends of the center section 44. The fastener 41 perpendicularly extends from a lower surface of the center section 44. The center section 44 is downwardly deformed to facilitate manual actuation thereof. Each arm 45 has a C-shaped flange 46 at a distal end thereof. The pair of flanges 46 forms a passageway 48 for extension of the fastener 41 therethrough. A pair of spaced locks 42 downwardly extends from a distal end of the fastener 41 and is symmetrical about a longitudinal axis 49 thereof. A space 43 is defined between the locks 42 to provide resiliency to allow inward deflection of the locks 42. Each lock 42 has a wide latch 50 forming a laterally facing inclined surface. The pair of locks 42 is contoured to facilitate alignment of the fastening devices 40 with the apertures 38 and the holes 12. A planar surface 51 is formed at a distal end of each lock 42 to avoid injury of a user.

In assembly, the fastening devices 40 extend through the apertures 38 of the heat sink 30 and the holes 12 of the PCB 10 with the locks 42 inwardly deflected. Once the locks 42 pass through the hole 12, the latches 50 resile thereby securing the heat sink 30 to the chipset package 20. The flanges 46 abut against inner surfaces 52 of longitudinal ends of the apertures 38. The arms 45 rest on the base 32 of the heat sink 30 to provide resilient engagement between the fastening devices 40, the heat sink 30 and the PCB 10.

The unitarily formed fastening device 40 is capable of being automatically assembled thereby facilitating time and cost efficient manufacture. The flanges 46 abut against the inner surfaces 52 of longitudinal ends of the apertures 38 whereby the fastening devices 40 can not rotate to ensure reliable engagement thereof with the heat sink 30. In addition, when the center section 44 is downwardly pressed, the movement of the flanges 46 is limited within the apertures 38 thereby ensuring proper function of the fastening device 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink apparatus for use in connection with an electronic device package mounted on a PCB, comprising:

a heat sink including a base being adapted to be in intimate thermal contact with the electronic device package and a pair of wings outwardly extending from the base, an aperture being defined through each wing in alignment with a corresponding hole in the PCB; and a pair of fastening devices each including a C-shaped spring member and a fastener projecting from the spring member, each of the fasteners being adapted for extending through the respective aperture and the corresponding hole to secure the wings to the PCB, the spring member resiliently urging the wings against the PCB, a pair of flanges being formed at ends of the spring member and adapted to be received in the respective aperture.

2. The heat sink apparatus claimed in claim 1, wherein the apertures of the heat sink are oval.

3. The heat sink apparatus claimed in claim 1, wherein each of the fastening devices are unitarily formed.

4. A fastening assembly for securing a first member to a second members comprising:

an aperture defined through the first member;

a hole defined in the second member in alignment with the aperture; and a fastening device including a C-shaped spring member and a fastener projecting from the spring member, the fastener being adapted to extend through the aperture and the hole to secure the first member to the second member, the spring member for resiliently urging the first member against the second member, a pair of flanges being formed at ends of the spring member and adapted to be received in the aperture.

5. The fastening assembly as claimed in claim 4, wherein the aperture of the first member is oval.

6. The fastening assembly as claimed in claim 4, wherein the fastening device is unitarily formed.

7. A fastening device assembly comprising:

a spring member extending in a horizontal direction with at least an arcuate arm providing flexibility thereof in a vertical direction;

a fastener downward extending from the spring member, at least a latch positioned at a distal free end of the fastener with flexibility thereof in a horizontal direction, and at least a lateral locking surface thereon; and a first plate with therein at least an aperture, being stacked on a second plate with therein a hole;

the fastener extending through both the aperture and the hole; wherein the lateral locking surface abuts against a bottom surface of the second plate while the arcuate arm is deformed to press against a top surface of the first plate, thereby tightly sandwiching said first plate and said second plate therebetween; and wherein a flange extends downward from a free end of the arcuate arm and is inserted into the corresponding aperture.

8. The assembly as claimed in claim 7, wherein said flange abuts against an inner surface of the corresponding aperture.

* * * * *